(12) United States Patent
Oh

(10) Patent No.: US 7,728,510 B2
(45) Date of Patent: Jun. 1, 2010

(54) ORGANIC LIGHT EMITTING DISPLAY WITH AUXILIARY ELECTRODE LINE AND METHOD OF FABRICATING THE SAME

(75) Inventor: Sang-Hun Oh, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 272 days.

(21) Appl. No.: 11/298,871

(22) Filed: Dec. 9, 2005

(65) Prior Publication Data

US 2006/0125390 A1 Jun. 15, 2006

(30) Foreign Application Priority Data

Dec. 14, 2004 (KR) .................... 10-2004-0105900

(51) Int. Cl.
 *H01J 1/62* (2006.01)
 *H01J 63/04* (2006.01)
(52) U.S. Cl. .................. 313/504; 313/499; 313/500; 313/505; 313/506; 315/169.1; 315/169.3
(58) Field of Classification Search ......... 313/498–512; 445/24–25; 315/169.1, 169.3; 428/690–691, 428/917; 438/26–29, 34, 82; 427/66, 532–535, 427/539, 58, 64; 257/40, 72, 98–100, 642–643, 257/759
See application file for complete search history.

(56) References Cited

U.S. PATENT DOCUMENTS

| | | | |
|---|---|---|---|
| 6,359,606 B1 | 3/2002 | Yudasaka | |
| 6,608,449 B2 | 8/2003 | Fukunaga | |
| 7,045,861 B2 * | 5/2006 | Takayama et al. | 257/347 |
| 7,148,502 B2 * | 12/2006 | Yamazaki et al. | 257/40 |
| 7,154,218 B2 * | 12/2006 | Murakami et al. | 313/506 |
| 7,189,996 B2 * | 3/2007 | Nakamura | 257/59 |
| 7,221,095 B2 * | 5/2007 | Yamazaki et al. | 313/509 |
| 7,230,271 B2 * | 6/2007 | Yamazaki et al. | 257/72 |
| 2003/0193056 A1 * | 10/2003 | Takayama et al. | 257/79 |

(Continued)

FOREIGN PATENT DOCUMENTS

JP          07-130652          5/1995

(Continued)

OTHER PUBLICATIONS

Chinese Certificate Patent, dated Nov. 12, 2008, for corresponding Chinese application 200510131469.X, noting listed references in this IDS.

(Continued)

*Primary Examiner*—Sikha Roy
*Assistant Examiner*—Jose M Diaz
(74) *Attorney, Agent, or Firm*—Christie, Parker & Hale, LLP

(57) ABSTRACT

Provided are an organic light emitting display (OLED) and a method of fabricating the same capable of improving product reliability by forming an auxiliary electrode line to be in contact with a second electrode power supply line to remove an organic layer on the auxiliary electrode line and minimize the organic layer on a pixel region, thereby preventing pixel shrinkage resulting from degradation of an organic emission layer caused by out-gassing from the organic layer.

10 Claims, 4 Drawing Sheets

U.S. PATENT DOCUMENTS

| | | | |
|---|---|---|---|
| 2004/0041753 A1* | 3/2004 | Nakanishi | 345/76 |
| 2004/0100191 A1* | 5/2004 | Park | 313/506 |
| 2004/0135151 A1* | 7/2004 | Okamoto et al. | 257/72 |
| 2004/0256980 A1* | 12/2004 | Tsuchiya | 313/503 |
| 2005/0012454 A1* | 1/2005 | Yamazaki et al. | 313/506 |
| 2006/0019573 A1* | 1/2006 | Koo et al. | 445/24 |
| 2006/0202615 A1* | 9/2006 | Murakami et al. | 313/506 |

FOREIGN PATENT DOCUMENTS

| | | |
|---|---|---|
| JP | 2000-299183 | 10/2000 |
| JP | 2003-323133 | 11/2003 |
| JP | 2004-062164 | 2/2004 |
| KR | 10-2004-0010304 | 1/2004 |

OTHER PUBLICATIONS

Korean Patent Gazette No. 10-0712111, published Apr. 27, 2007; in the name of Samsung SDI Co., Ltd., referencing corresponding Korean priority application 10-2004-0105900, and listing JP 2000-299183 and JP 2004-062164 as prior art.

\* cited by examiner

ORGANIC LIGHT EMITTING DISPLAY WITH AUXILIARY ELECTRODE LINE AND METHOD OF FABRICATING THE SAME

CROSS-REFERENCE TO RELATED APPLICATION

This application claims priority to and the benefit of Korean Patent Application No. 10-2004-0105900, filed Dec. 14, 2004, which is incorporated herein by reference in its entirety.

BACKGROUND OF THE INVENTION

1. Field of the Invention

The present invention relates to an organic light emitting display (OLED) and a method of fabricating the same, and more particularly, to an OLED and a method of fabricating the same that is capable of improving product reliability by forming an auxiliary electrode line to be in contact with a second electrode power supply line to remove an organic layer on the auxiliary electrode line and minimize the organic layer on a pixel region, thereby preventing pixel shrinkage resulting from degradation of an organic emission layer caused by out-gassing from the organic layer.

2. Description of the Related Art

An organic light emitting display (OLED) is an emissive flat panel display that has beneficial characteristics such as a wide viewing angle, rapid response speed, small thickness, low manufacturing cost, high contrast, and so on. Accordingly, it is attracting attention as a next-generation flat panel display.

Conventionally, the OLED includes an anode, a cathode, and an organic emission layer formed therebetween, so that holes supplied from the anode and electrons supplied from the cathode are combined in the organic emission layer to generate excitons, i.e., electron-hole pairs, to thereby emit light by energy generated when the excitons de-excite and return to ground state.

Generally, the OLED is classified into a passive matrix OLED and an active matrix OLED according to a manner in which N×M pixels disposed in the form of a matrix are driven. In the passive matrix OLED, an anode and a cathode cross each other and electrode lines are selectively driven. In the active matrix OLED, a thin film transistor and a capacitor are connected to a pixel electrode of each pixel region to maintain a voltage by a capacitance.

Each unit pixel of the active matrix OLED basically includes a switching transistor, a driving transistor, a capacitor, and an EL device. A common power source is provided to the driving transistor and the capacitor from a power supply line, which functions to control current flowing to the EL device through the driving transistor. In addition, an auxiliary electrode line is an auxiliary power supply line for supplying power to a second electrode to form a potential difference between source and drain electrodes and the second electrode to make current flow.

FIG. 1 is a cross-sectional view illustrating a conventional active OLED and a method of fabricating the same.

Referring to FIG. 1, the conventional active OLED includes a substrate 100 having a pixel region (a) and a metal line region (b), and a buffer layer 105 formed on the substrate 100. A semiconductor layer 110 including source and drain regions 110a and 110c and a channel region 110b is patterned on the buffer layer 105 of the pixel region (a).

Then, a gate insulating layer 120 is formed on the entire surface of the semiconductor layer 110, and a gate electrode 130 is formed on the gate insulating layer 120 of the pixel region (a) corresponding to the channel region 110b. An interlayer insulating layer 140 is formed on the entire surface of the substrate including the gate electrode 130, and the source and drain regions 110a and 110b of the semiconductor layer 110 are connected to source and drain electrodes 145 through contact holes 141 formed in the interlayer insulating layer 140 of the pixel region (a). When the source and drain electrodes 145 of the pixel region (a) are formed, a first conductive pattern 147 made of the same material as the source and drain electrodes 145 is also formed on the metal line region (b), which functions as an auxiliary electrode line. As a result, a thin film transistor including the semiconductor layer 110, the gate electrode 130, and the source and drain electrodes 145 is formed.

Then, an insulating layer 150 functioning as a passivation layer and/or a planarization layer is formed on the entire surface of the substrate including the source and drain electrodes 145 and the first conductive pattern 147, and the insulating layer 150 formed on the first conductive pattern 147 of the metal line region (b) is removed by an etching process to expose an upper portion of the first conductive pattern 147.

A via-hole 155 for exposing one of the source and drain electrodes 145 is formed at the insulating layer 150 of the pixel region (a), and a first electrode 170 is patterned to be in contact with one of the source and drain electrodes 145 through the via-hole 155 and to expand onto the insulating layer 150.

Then, a pixel defining layer 175 having an opening is formed on the first electrode 170 and the insulating layer 150, excluding the metal line region (b). An organic layer 180 including at least an organic emission layer is patterned on the first electrode 170 exposed in the opening of the pixel region (a), and a second electrode 190 is formed on the entire surface of the substrate including the organic layer 180. The second electrode 190 of the metal line region (b) is connected to the first conductive pattern 147.

The first conductive pattern 147 may be formed of one material selected from MoW, Mo, and W. At this time, the material has a higher heat capacity than a silicon nitride (SiNx) layer and heat transfer to the silicon nitride layer cannot be smoothly performed due to this difference, which causes an increase in heat resistance. As a result, when curing the organic layer, the organic layer cannot be smoothly reflowed to each region and consequently the thickness of the organic layer differs in each region after curing. Here, residual gas remaining around the first conductive pattern and an adjacent pixel region may cause a pixel shrinkage phenomenon due to degradation of the organic emission layer by out-gassing.

In addition, when the second electrode is formed to be in contact with the first conductive pattern, a metal material of the first conductive pattern of the metal line region is exposed when forming the first electrode of the pixel region, resulting in the metal line being damaged by an etchant or developing agent.

SUMMARY OF THE INVENTION

The present invention, therefore, provides an OLED and a method of fabricating the same capable of improving product reliability by forming an auxiliary electrode line to be in contact with a second electrode power supply line to remove an organic layer on the auxiliary electrode line and minimize the organic layer on a pixel region, thereby preventing pixel shrinkage resulting from degradation of an organic emission layer caused by out-gassing from the organic layer.

In an exemplary embodiment of the present invention, an OLED includes: a substrate; a thin film transistor formed on a pixel region of the substrate and having a semiconductor layer, a gate electrode, and source and drain electrodes; a first conductive pattern formed on a metal line region of the substrate at the same layer as the gate electrode; an interlayer insulating layer formed to expose a portion of the first conductive pattern; a passivation layer and a planarization layer formed on the thin film transistor, excluding the metal line region of the substrate; a second conductive pattern formed to be in contact with the first conductive pattern and a first electrode formed through a via-hole in the passivation layer and the planarization layer; a pixel defining layer formed on the pixel region excluding the metal line region of the substrate and having an opening which exposes the first electrode; an organic layer formed on the exposed first electrode and including at least an organic emission layer; and a second electrode formed on the organic layer.

In another exemplary embodiment according to the present invention, a method of fabricating an OLED includes: providing a substrate; forming a thin film transistor including a semiconductor layer, a gate electrode, and source and drain electrodes, on a pixel region of the substrate; forming a first conductive pattern at the same layer as a metal line region of the substrate when the gate electrode is formed; forming an interlayer insulating layer for exposing a portion of the first conductive pattern; forming a passivation layer and a planarization layer on the thin film transistor excluding the metal line region of the substrate using an etching process; forming a first electrode through a via-hole in the passivation layer and the planarization layer; forming a second conductive pattern to be in contact with the first conductive pattern when the first electrode is formed; forming a pixel defining layer having an opening which exposes the first electrode on the pixel region excluding the metal line region of the substrate; forming an organic layer including at least an organic emission layer on the exposed first electrode; and forming a second electrode on the organic layer.

BRIEF DESCRIPTION OF THE DRAWINGS

The above and other features of the present invention will be described in reference to certain exemplary embodiments thereof with reference to the attached drawings in which.

DETAILED DESCRIPTION OF THE INVENTION

The present invention will now be described more fully hereinafter with reference to the accompanying drawings, in which preferred embodiments of the invention are shown.

Figure 1:
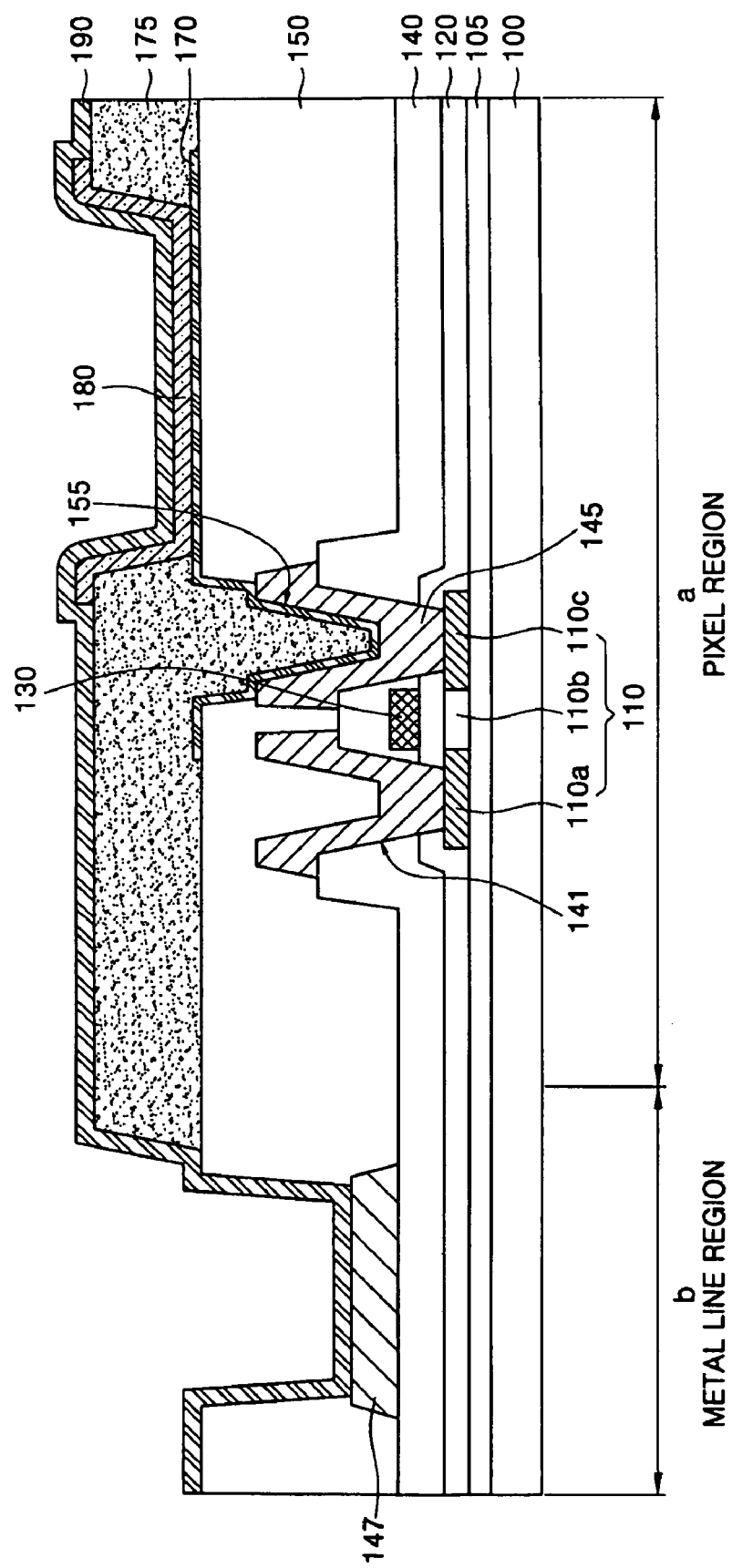
FIG. 1 is a cross-sectional view of a conventional active OLED.
Figure 2:
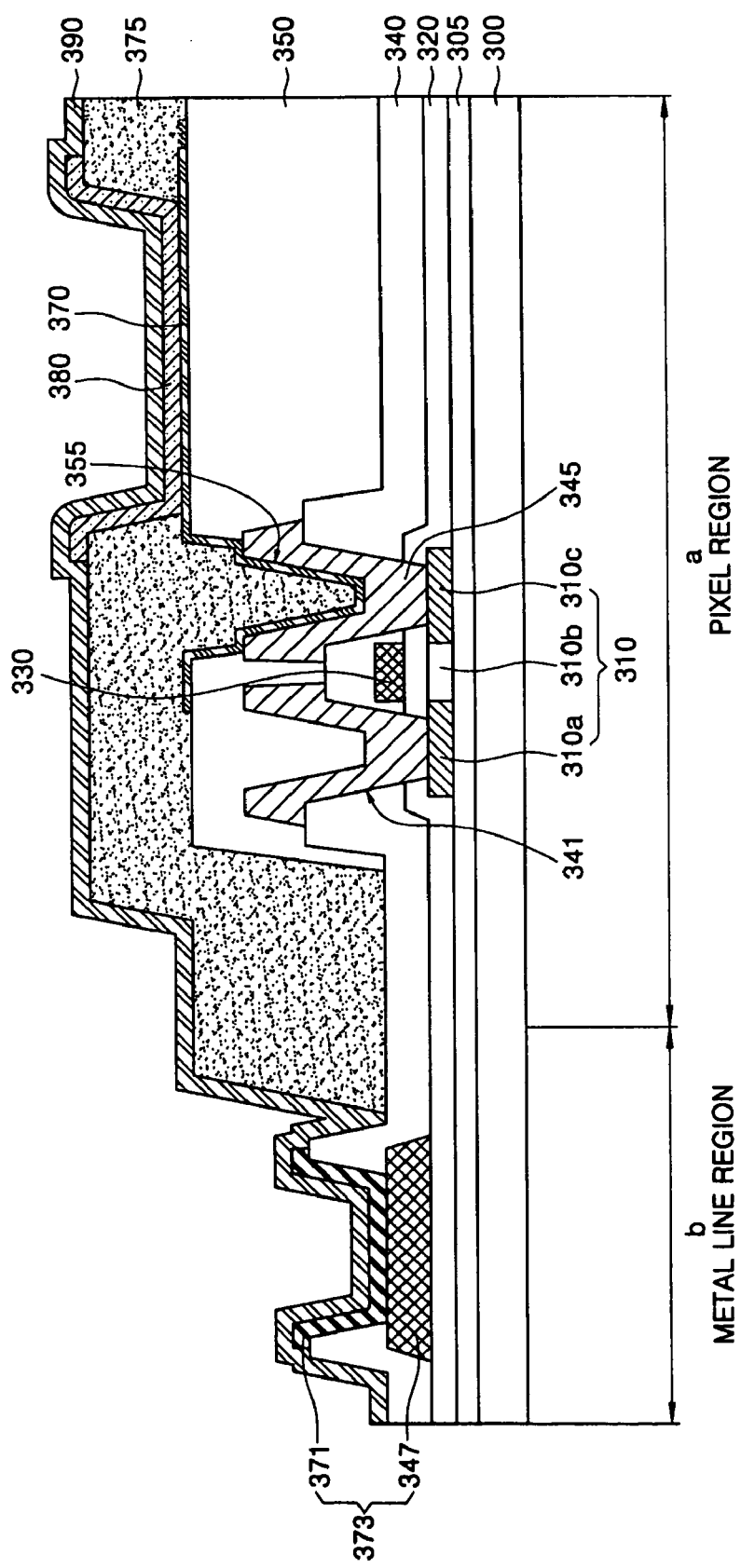
FIG. 2 is a cross-sectional view of an active OLED in accordance with the present invention.

FIG. 2 is a cross-sectional view of an active OLED in accordance with the present invention.

Referring to FIG. 2, the active OLED in accordance with the present invention includes a substrate 300 having a pixel region (a) and a metal line region (b), and a buffer layer 305 is formed on the entire surface of the substrate 300. The buffer layer 305 is formed of a silicon nitride layer, a silicon oxide layer, or a double layer thereof. Polysilicon or amorphous silicon is formed in the pixel region (a) on the buffer layer 305 and then patterned to form a semiconductor layer 310 having source and drain regions 310a and 310c and a channel region 310b. Preferably, the semiconductor layer 310 is formed of polysilicon.

A gate insulating layer 320 is formed on the entire surface of the substrate including the semiconductor layer 310. The gate insulating layer 320 may be formed of a silicon nitride layer, a silicon oxide layer, and a double layer thereof.

A gate metal material is deposited on the gate insulating layer 320 of the pixel region (a) and then patterned to form a gate electrode 330 corresponding to a predetermined region of the semiconductor layer 310. The gate electrode 330 is formed of one selected from a group consisting of Mo, W, MoW, $WSi_2$, $MoSi_2$, and Al. A first conductive pattern 347 is formed on the gate insulating layer 320 of the metal line region (b) at the same layer as the gate electrode 330 while the gate electrode 300 is formed. The first conductive pattern 347 is formed of the same material as the gate electrode 330.

A common power supply line Vdd and a data line Vdata (not shown) are simultaneously formed while forming the first conductive pattern 347, and the first conductive pattern 347 is connected to the data line, the common power supply line, and both ends of an auxiliary electrode line through a link hole (not shown).

Then, an interlayer insulating layer 340 is formed on the entire surface of the substrate including the gate electrode 330 to expose a portion of the first conductive pattern 347.

One of n-type and p-type impurities is injected into the semiconductor layer 310 using a mask to define the source and drain regions 310a and 310c and the channel region 310b interposed therebetween.

Next, a metal material is deposited on the interlayer insulating layer 340 including contact holes 341 which expose the source and drain regions 310a and 310c in the pixel region (a), and then the metal material is patterned to form source and drain electrodes 345 to be in contact with the source and drain regions 310a and 310c of the semiconductor layer 310 through the contact holes 341, respectively.

As described above, the semiconductor layer 310, the gate electrode 330, and the source and drain electrodes 345 compose a thin film transistor.

Then, a passivation layer and/or a planarization layer 350 are formed on the thin film transistor of the pixel region (a) and the first conductive pattern 347 of the metal line region (b). The passivation layer and the planarization layer 350 are an insulating layer, more specifically, the passivation layer functions to protect the thin film transistor from contamination, which is formed of one of a silicon nitride layer, a silicon oxide layer, and a double layer thereof. In addition, the planarization layer is formed to compensate a lower step of the passivation layer, and generally formed of one organic material selected from a group consisting of acryl resin, benzocyclobutene (BCB), polyimide (PI), and polyamide (PA). Then, the planarization layer is cured.

After curing, the passivation layer and the planarization layer 350 on the first conductive pattern of the metal line region (b) are removed by an etching process. In addition, the passivation layer and the planarization layer 350 existing between the pixel region (a) and the metal line region (b) are removed by a photolithography process or an etching process, excluding a region at which a first electrode is to be formed. Since the passivation layer and the planarization layer are formed on the thin film transistor excluding the metal line region (b) of the substrate, it is possible to form the organic layer having a uniform thickness with a small step and to prevent pixel shrinkage resulting from degradation of an organic emission layer caused by out-gassing from the organic planarization layer into the organic emission layer, after the subsequent process of depositing an organic layer.

A common power supply line Vdd and a data line Vdata (not shown) are simultaneously formed while forming the first conductive pattern 347, and the first conductive pattern 347 is connected to the data line, the common power supply line, and both ends of an auxiliary electrode line through a link hole (not shown).

Then, a via-hole 355 for exposing one of the source and drain electrodes 345 is formed in the passivation layer and the planarization layer 350 of the pixel region (a). A first electrode 370 is formed to be in contact with one of the source and drain electrodes 345 through the via-hole 355. When the first electrode 370 is an anode, the first electrode 370 may be a transparent electrode formed of indium tin oxide (ITO) or indium zinc oxide (IZO) having a high work function, or a transparent electrode including a reflective layer formed of a metal such as Al or an Al alloy having high reflectivity characteristics, at its lower part. When the first electrode 370 is a cathode, the first electrode 370 may be a reflective electrode having a large thickness and formed of one conductive metal having a low work function selected from a group consisting of Mg, Ca, Al, Ag, and an alloy thereof, or a reflective electrode having a small thickness.

Then, when the first electrode 370 is formed, a second conductive pattern 371 is formed on the first conductive pattern 347 of the metal line region (b). The second conductive pattern 371 is formed of the same material as the first electrode 370, and electrically connected to the first conductive pattern 347. The second conductive pattern 371 and the first conductive pattern 347 form an auxiliary electrode line of a second electrode, and a voltage is supplied to the second electrode to prevent IR drop. In addition, the second conductive pattern 371 can prevent the metal material for forming the first conductive pattern 347 from being exposed due to an etchant or developing agent when patterning the first electrode 370 of the pixel region (a) to thereby prevent damage of the metal line of the metal line region (b).

Then, after depositing an organic material on the first electrode 370 of the pixel region (a), the organic material may be etched to further form a pixel defining layer 375 having an opening. The pixel defining layer 375 may be formed of one organic material selected from a group consisting of polyimide (PI), polyamide (PA), acryl resin, benzocyclobutene (BCB), and phenol resin. The pixel defining layer 375 formed on the second conductive pattern 371 is removed when the opening is formed.

Then, an organic layer 380 including at least an organic emission layer is formed on the first electrode 370 exposed in the opening of the pixel region (a). The organic layer 380 may further include at least one selected from a group consisting of a hole injection layer, a hole transport layer, an electron transport layer, and an electron injection layer, in addition to the organic emission layer.

Then, a second electrode 390 is formed on the entire surface of the substrate including the organic layer 380. When the first electrode 370 is a transparent anode or a transparent electrode including a reflective layer, the second electrode 390 may be a reflective electrode formed of one conductive metal having a low work function and selected from a group consisting of Mg, Ca, Al, Ag, and an alloy thereof. When the first electrode 370 is a cathode, the second electrode 390 may be a transparent electrode such as ITO or IZO.

Hereinafter, a method of fabricating an active OLED in accordance with the present invention will be described.

Referring to FIG. 2, a substrate 300 formed of glass, plastic or quartz is provided. The substrate 300 has a pixel region (a) and a metal line region (b). Then, a buffer layer 305 formed of a silicon nitride layer, a silicon oxide layer, or a double layer thereof is formed on the substrate 300. The buffer layer 305 may be formed by a plasma-enhanced chemical vapor deposition (PECVD) method, a low-pressure chemical vapor deposition (LPCVD) method, or the like.

A semiconductor layer 310 having source and drain regions 310a and 310c and a channel region 310b is formed on the buffer layer 305 of the pixel region (a). The semiconductor layer 310 is formed by depositing amorphous silicon using a chemical vapor deposition (CVD) method, crystallizing the amorphous silicon to a polysilicon layer using a crystallization method, and then patterning the polysilicon layer. The CVD method may employ PECVD or LPCVD. When the amorphous silicon is deposited by the PECVD, a silicon layer is deposited and then dehydrogenated by heat treatment to lower a concentration of hydrogen.

In addition, the crystallization method of the amorphous silicon may employ at least one of a rapid thermal annealing (RTA) method, a metal induced crystallization (MIC) method, a metal induced lateral crystallization (MILC) method, a solid phase crystallization (SPC) method, an excimer laser crystallization (ELA) method, and a sequential lateral solidification (SLS) method.

Then, a gate insulating layer 320 is formed on the semiconductor layer 310 all over the substrate. The gate insulating layer 320 is deposited by PECVD or LPCVD.

Then, a gate metal material is deposited on the gate insulating layer 320 of the pixel region (a) and then patterned to form a gate electrode 330 corresponding to a predetermined region of the semiconductor layer 310. The gate electrode 330 may be formed of one selected from a group consisting of Mo, W, MoW, $WSi_2$, $MoSi_2$, and Al, and may be deposited by LPCVD or PECVD and patterned.

When the gate electrode 330 is formed on the gate insulating layer 320 of the metal line region (b), a first conductive pattern 347 is formed. The first conductive pattern 347 may be formed of the same material as the gate electrode 330, and deposited by LPCVD or PECVD and patterned.

A common lower supply line Vdd and a data line Vdata (not shown) are simultaneously formed while forming the first conductive pattern 347, and the first conductive pattern 347 is connected to the data line, the common power supply line, and both ends of an auxiliary electrode line through a link hole (not shown).

Then, an interlayer insulating layer 340 is formed on the entire surface of the substrate including the gate electrode 330 to expose a portion of the first conductive pattern 347. The interlayer insulating layer 340 may be formed of a silicon nitride layer, a silicon oxide layer, and a double layer thereof, and deposited by PECVD or LPCVD.

Then, impurities are injected into the semiconductor layer 310 using a mask to form source and drain regions 310a and 310c on the semiconductor layer 310 and to define a channel region 310b interposed between the source and drain regions 310a and 310c. The impurities may be one of n-type and p-type impurities. The n-type impurities may be formed of one selected from a group consisting of P, As, Sb, and Bi, and the p-type impurities may be formed of one selected from a group consisting of B, Ga, In, Al, and Ti.

Then, contact holes 341 are formed in the interlayer insulating layer 340 of the pixel region (a) to expose the source and drain regions 310a and 310c.

Then, a metal material is deposited on the interlayer insulating layer 340 having the contact holes 341 in the pixel region (a), and the metal material is patterned to form source and drain electrodes 345 which are in contact with the source and drain regions 310a and 310c of the semiconductor layer 310 through the contact holes 341, respectively. The source and drain electrodes 345 may be formed of one selected from a group consisting of Mo, W, MoW, $WSi_2$, $MoSi_2$, and Al, and may be formed by depositing using a sputtering method or a vacuum deposition method and then patterning through an etching process using a mask.

As described above, the semiconductor layer 310, the gate electrode 330, and the source and drain electrodes 345 compose a thin film transistor.

A passivation layer and a planarization layer 350 are formed on the thin film transistor of the pixel region (a) and the first conductive pattern 347 of the metal line region (b). In the present invention, in order to remove a step of lower part, an insulating layer is formed together with the planarization layer. The passivation layer may be formed of a silicon nitride layer, a silicon oxide layer, or a double layer thereof. The planarization layer may be formed of one organic material selected from a group consisting of acryl resin, benzocyclobutene (BCB), polyimide (PI), polyamide (PA), and phenol resin, and may be formed by depositing using a spin coating method and then curing the insulating layer 350.

The first conductive pattern 347 composing a portion of the auxiliary electrode line 373 may be formed of one material selected from MoW, Mo, and W. At this time, the material has a higher heat capacity than a silicon nitride ($SiN_x$) layer so that heat transfer to the silicon nitride layer cannot be smoothly performed due to a difference therebetween.

Figure 3:
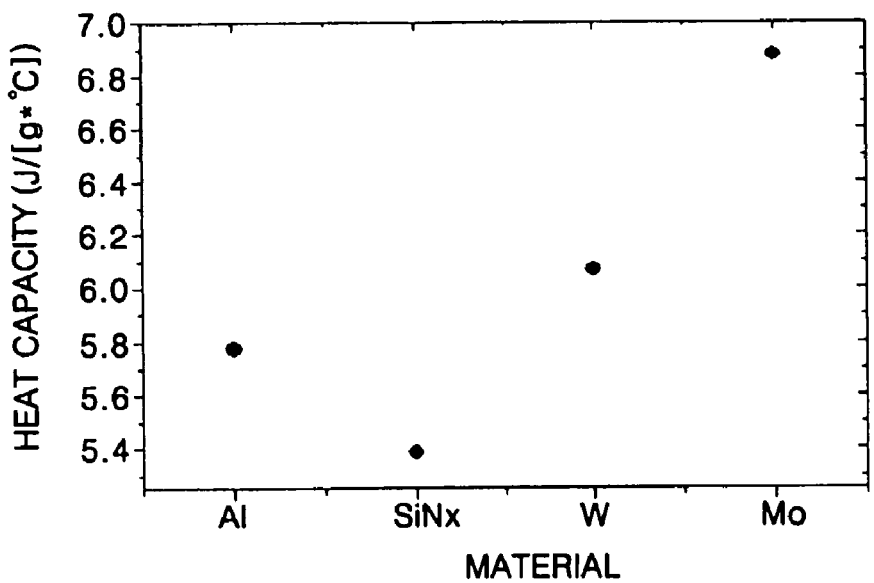
FIG. 3 is a graph showing properties of a first conductive pattern of the present invention.
Figure 4:
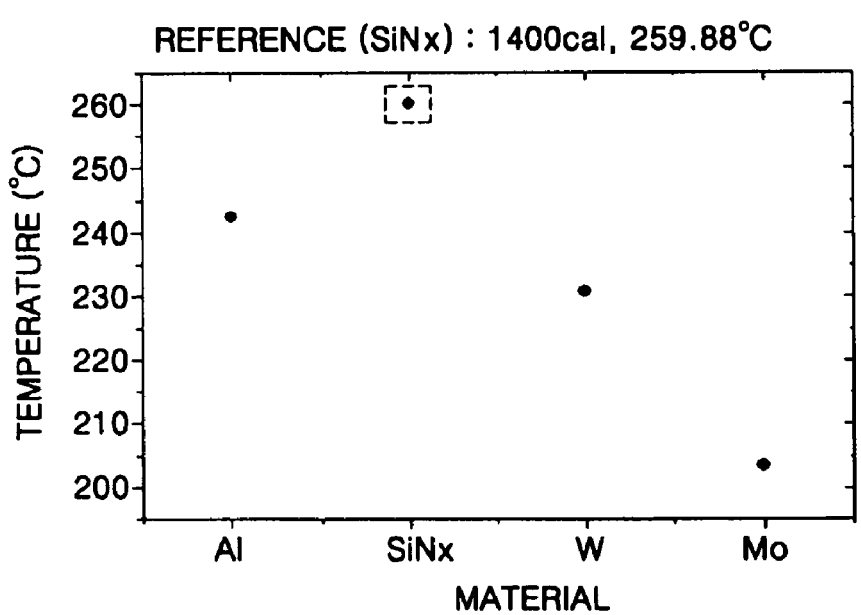
FIG. 4 is a graph showing heat capacity according to temperature of properties of the first conductive pattern of the present invention.

Table 1 and FIG. 3 represent properties of a first conductive pattern, and Table 2 and FIG. 4 represent heat capacity according to temperature of the first conductive pattern.

TABLE 1

| Properties | Mass(g) | Specific heat (cal/[g * ° C.] | Heat capacity (cal/° C.) | Thermal conductivity (cal/cm * s) |
| --- | --- | --- | --- | --- |
| Al | 26.982 | 0.214 | 5.774 | 0.55 |
| $SiN_x$ | 32.064 | 0.168 | 5.387 | 0.36 |
| W | 183.85 | 0.033 | 6.067 | 0.35 |
| Mo | 95.54 | 0.072 | 6.879 | 0.33 |

TABLE 2

| | 260° C. reference | | |
| --- | --- | --- | --- |
| Properties | Q = 1778.54 cal (Mo) | Q = 1400 cal (Si) | ° C. |
| Al | 309.75° C. | 242.46° C. | 1501 cal |
| $SiN_x$ | 330.15° C. | 259.88° C. | 1400 cal |
| W | 293.14° C. | 230.75° C. | 1577 cal |
| Mo | 260.00° C. | 203.51° C. | 1788 cal |

Referring to Table 1 and FIG. 3, it is appreciated that Al has a thermal conductivity higher than those of $SiN_x$, W and Mo by about 0.2 cal/cm*s, while the thermal conductivities of $SiN_x$, W and Mo have no significant difference. However, the heat capacities of W and Mo are higher than that of Al or $SiN_x$.

In addition, referring to Table 2 and FIG. 4, with reference to SiNx, 1400 cal, and 260° C., the heat capacities of Mo, W and Al are higher than that of SiNx so that heat transfer from Mo, W and Al to SiNx cannot be smoothly performed due to a difference therebetween to make it difficult to reflow the organic layer during curing the organic layer.

Figure 5:
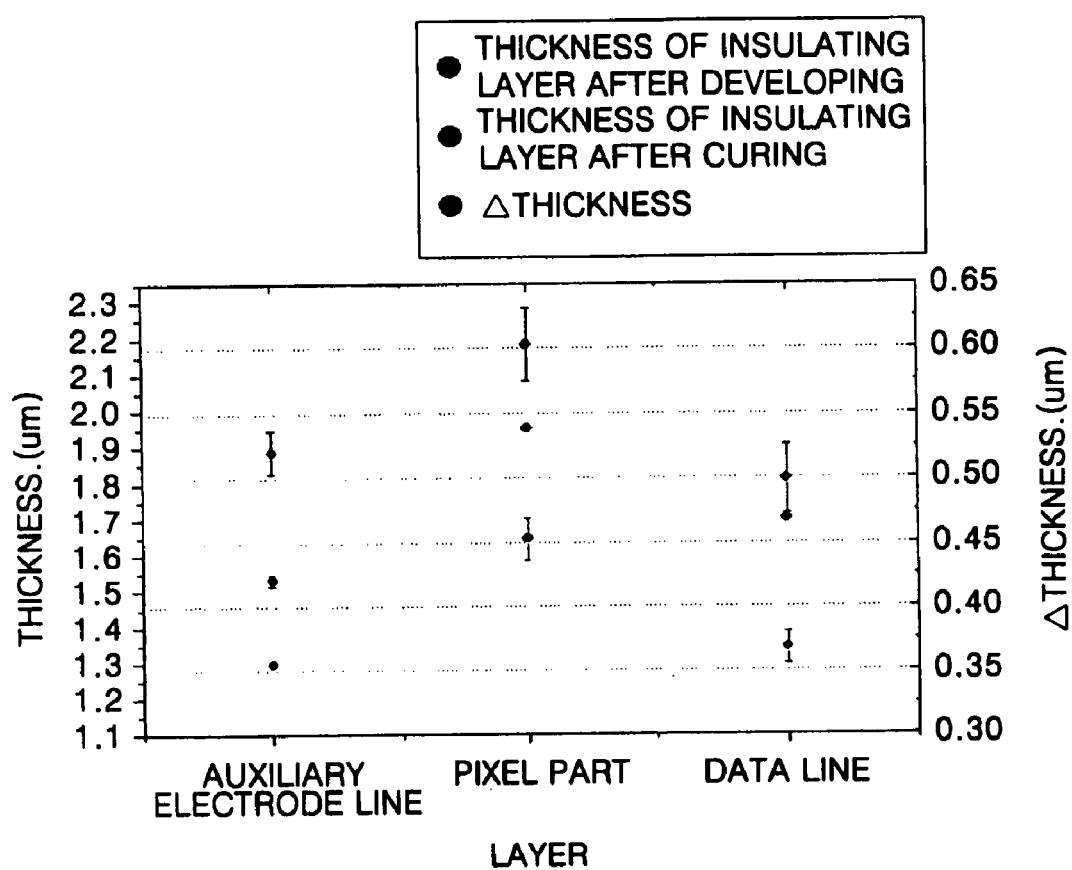
FIG. 5 is a graph showing the thickness of an organic insulating layer before and after curing and developing each layer of the OLED.

FIG. 5 is a graph showing the thickness of an organic insulating layer before and after curing and developing each layer of the OLED.

Referring to FIG. 5, after developing an auxiliary electrode line, a pixel part, and a data line Vdata (not shown), the insulating layer has a thickness smaller in order of the pixel part, the auxiliary electrode line, and the data line. However, when the thickness of the insulating layer is measured after the developed layer is cured, it is appreciated that the auxiliary electrode line is the least cured, while there is no significant difference, and the curing is well performed in the order of the pixel part, the data line, and the auxiliary electrode line.

When the reflow of each region is not performed well during curing the organic layer, since each region has a different curing effect to make the thickness of the organic layer different according to the regions after curing and to cause residual gases to remain in the organic layer, the passivation layer and the planarization layer 350 of the pixel region (a) are minimized by photolithography and etching processes in order not to affect adjacent pixel regions, and the passivation layer and the planarization layer 350 of the metal line region (b) are entirely removed by an etching process. As a result, it is possible to prevent pixel shrinkage resulting from degradation of the organic emission layer caused by out-gassing from the organic insulating layer into the organic emission layer, after the subsequent process of depositing the organic layer.

A common lower supply line Vdd and a data line Vdata are simultaneously formed while forming the first conductive pattern 347, and the first conductive pattern 347 is connected to the data line, the common power supply line, and both ends of an auxiliary electrode line through a link hole (not shown).

Then, a via-hole 355 is formed in the passivation layer and the planarization layer 350 of the pixel region (a) to expose one of the source and drain electrodes 345.

A first electrode 370 is then formed to be in contact with the exposed source or drain electrode 345 through the via-hole 355, and to extend onto the passivation layer and the planarization layer 350. The first electrode 370 may be formed by a sputtering method, an ion plating method, or a vacuum deposition method, preferably, the sputtering method. The first electrode 370 is patterned by a wet etching process which selectively removes a photoresist (PR) layer formed by a photolithography process after the deposition.

Then, a second conductive pattern 371 is formed on the first conductive pattern 347 of the metal line region (b) to form an auxiliary electrode line 373 of a second electrode. The second conductive pattern 371 is electrically connected to the first conductive pattern 347, and formed of the same material as the first electrode 370. The second conductive pattern 371 may be formed by depositing using a sputtering method, an ion plating method, or a vacuum deposition method, and then patterning using an etching process.

After depositing an organic material on the first electrode 370 of the pixel region (a), the organic material may be etched to further form a pixel defining layer 375 having an opening. The pixel defining layer 375 may be formed of one organic material selected from a group consisting of polyimide (PI), polyamide (PA), acryl resin, benzocyclobutene (BCB), and phenol resin, using a spin coating method.

Then, an organic layer 380 including at least an organic emission layer is formed on the first electrode 370 exposed in the opening of the pixel region (a). The organic layer 380 may be formed by a vacuum deposition method, a spin coating method, an inkjet printing method, a laser induced thermal imaging (LITI) method, or the like, preferably, the spin coating method. In addition, the organic layer 380 may be patterned by the LITI method, or a vacuum deposition method using a shadow mask.

The organic emission layer may be formed of a small molecule material or a polymer material. The small molecule material is one selected from a group consisting of Alq3, anthracene, cyclo pentadiene, BeBq2, Almq, Balq, DPVBi, BSA-2, and 2PSP.

The polymer material is one selected from a group consisting of polyphenylene (PPP) and its derivatives, poly(p-phenylenevinylene) (PPV) and its derivatives, and polythiophene (PT) and its derivatives.

Then, a second electrode 390 is formed on the organic layer 380 all over the substrate using a vacuum deposition method.

The substrate including the second electrode 390 is encapsulated together with an upper substrate using a conventional encapsulation method to complete the OLED.

While the present invention illustrates the OLED including the thin film transistor employing a top gate type for the convenience of description, the present invention is not limited thereto.

As can be seen from the foregoing, the present invention provides an OLED capable of improving product reliability by forming an auxiliary electrode line to be in contact with a second electrode power supply line to remove an organic layer on the auxiliary electrode line and minimize the organic layer on a pixel region, thereby preventing pixel shrinkage resulting from degradation of an organic emission layer caused by out-gassing from the organic layer. In addition, it is possible to prevent IR drop and interconnection damage by forming an auxiliary electrode line of a second electrode.

Although the present invention has been described with reference to certain exemplary embodiments thereof, changes may be made to the described embodiments without departing from the scope of the present invention.

What is claimed is:

1. An organic light emitting display (OLED) comprising:
   a substrate;
   a thin film transistor on a pixel region of the substrate and having a semiconductor layer, a gate electrode, and source and drain electrodes;
   a first conductive pattern on a metal line region of the substrate at a same layer as the gate electrode;
   an insulating layer exposing a portion of the first conductive pattern;
   at least one of a passivation layer or a planarization layer on the thin film transistor, and spaced apart from the metal line region of the substrate;
   a second conductive pattern in contact with the first conductive pattern;
   a first electrode electrically connected with the source electrode or the drain electrode;
   a pixel defining layer on the pixel region excluding the metal line region of the substrate and having an opening which exposes a portion of the first electrode;
   an organic layer on the exposed portion of the first electrode and comprising at least an organic emission layer; and
   a second electrode on the organic layer,
   wherein a portion of the second electrode overlaps with the second conductive pattern and the first conductive pattern.

2. The OLED according to claim 1, wherein the first conductive pattern comprises a material selected from the group consisting of Mo, W, MoW, WSi$_2$, MoSi$_2$, and Al.

3. The OLED according to claim 2, wherein the first conductive pattern comprises a sputtered pattern or a vacuum deposited pattern.

4. The OLED according to claim 1, wherein the second conductive pattern comprises a same material as the first electrode.

5. The OLED according to claim 4, wherein the first electrode comprises ITO or IZO.

6. The OLED according to claim 1, wherein the first and second conductive patterns comprise an auxiliary electrode line of the second electrode.

7. The OLED according to claim 1, wherein the first electrode is an anode or a cathode.

8. The OLED according to claim 1, wherein the first conductive pattern comprises a same material as the gate electrode.

9. An organic light emitting display (OLED) comprising:
   a substrate;
   a thin film transistor on a pixel region of the substrate and having a semiconductor layer, a gate electrode, and source and drain electrodes;
   a first conductive pattern on a metal line region of the substrate at a same layer as the gate electrode;
   an insulating layer exposing a portion of the first conductive pattern;
   at least one of a passivation layer or a planarization layer on the thin film transistor, and spaced apart from the metal line region of the substrate;
   a second conductive pattern in contact with the first conductive pattern;
   a first electrode electrically connected with the source or the drain electrode;
   a pixel defining layer on the pixel region excluding the metal line region of the substrate and having an opening which exposes a portion of the first electrode;
   an organic layer on the exposed portion of the first electrode and comprising at least an organic emission layer; and
   a second electrode on the organic layer and in contact with the second conductive pattern at the metal line region of the substrate,
   wherein a portion of the second electrode overlaps with the second conductive pattern and the first conductive pattern.

10. The OLED according to claim 1, wherein the second electrode electrically contacts both the second conductive pattern and the first conductive pattern on the metal line region where the second electrode overlaps with the second conductive pattern and the first conductive pattern.

* * * * *